(12) United States Patent
Choi

(10) Patent No.: US 12,453,104 B2
(45) Date of Patent: Oct. 21, 2025

(54) SEMICONDUCTOR PACKAGE AND METHOD OF MANUFACTURING THE SEMICONDUCTOR PACKAGE

(71) Applicant: SAMSUNG ELECTRONICS CO., LTD., Suwon-si (KR)

(72) Inventor: Keunho Choi, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 424 days.

(21) Appl. No.: 18/178,235

(22) Filed: Mar. 3, 2023

(65) Prior Publication Data

US 2023/0413585 A1 Dec. 21, 2023

(30) Foreign Application Priority Data

Jun. 16, 2022 (KR) ........................ 10-2022-0073290

(51) Int. Cl.
*H10B 80/00* (2023.01)
*H01L 21/56* (2006.01)
(Continued)

(52) U.S. Cl.
CPC ........... *H10B 80/00* (2023.02); *H01L 21/561* (2013.01); *H01L 23/291* (2013.01); *H01L 23/3171* (2013.01); *H01L 24/32* (2013.01); *H01L 24/33* (2013.01); *H01L 24/48* (2013.01); *H01L 24/73* (2013.01); *H01L 24/92* (2013.01); *H01L 2224/32145* (2013.01); *H01L 2224/32225* (2013.01); *H01L 2224/33181* (2013.01); *H01L 2224/48091* (2013.01); *H01L 2224/48105* (2013.01); *H01L 2224/48145* (2013.01); *H01L 2224/48227* (2013.01);
(Continued)

(58) Field of Classification Search
CPC ..... H10B 80/00; H01L 21/561; H01L 23/291; H01L 23/3171; H01L 24/32; H01L 24/33; H01L 24/48; H01L 24/73; H01L 24/92; H01L 25/0657
USPC ....................................................... 257/734
See application file for complete search history.

(56) References Cited

U.S. PATENT DOCUMENTS 6,815,234 B2 11/2004 Wellhausen et al.
8,785,305 B2 7/2014 Ramdani
(Continued)

FOREIGN PATENT DOCUMENTS

KR 20020035939 A 5/2002
KR 20190061362 A 6/2019
KR 102041108 B1 11/2019

*Primary Examiner* — Jasmine J Clark
(74) *Attorney, Agent, or Firm* — Wolf, Greenfield & Sacks, P.C.

(57) ABSTRACT

A semiconductor package includes a package substrate, a chip stack structure on the package substrate, the chip stack structure including a base chip having a first thickness and a plurality of upper chips sequentially stacked on the base chip, wherein the plurality of upper chips each have a second thickness smaller than the first thickness, and a sealing member on an upper surface of the package substrate and on the chip stack structure. At least one of the plurality of upper chips includes a chip substrate having opposite first and second surfaces, a circuit layer on the first surface, and a stress compensation layer on the second surface and having an internal stress that offsets a warpage of the chip substrate.

20 Claims, 13 Drawing Sheets

(51) Int. Cl.
*H01L 23/00* (2006.01)
*H01L 23/29* (2006.01)
*H01L 23/31* (2006.01)

(52) U.S. Cl.
CPC ............... *H01L 2224/73215* (2013.01); *H01L 2224/73265* (2013.01); *H01L 2224/92165* (2013.01); *H01L 2224/92247* (2013.01)

(56) References Cited

U.S. PATENT DOCUMENTS

| | | |
|---|---|---|
| 8,975,092 B2 | 3/2015 | Uchibori et al. |
| 9,741,668 B2 | 8/2017 | Kim |
| 9,899,337 B2 | 2/2018 | Chang et al. |
| 10,347,591 B2 | 7/2019 | Bellotti et al. |
| 10,720,396 B2 | 7/2020 | Roh |
| 11,164,749 B1 | 11/2021 | Chong et al. |
| 2021/0384166 A1* | 12/2021 | Zeng .................... H01L 23/562 |

* cited by examiner

SEMICONDUCTOR PACKAGE AND METHOD OF MANUFACTURING THE SEMICONDUCTOR PACKAGE

PRIORITY STATEMENT

This application claims priority under 35 U.S.C. § 119 to Korean Patent Application No. 10-2022-0073290, filed on Jun. 16, 2022 in the Korean Intellectual Property Office (KIPO), the contents of which are herein incorporated by reference in their entirety.

BACKGROUND

1. Field

Example embodiments relate to a semiconductor package and a method of manufacturing the semiconductor package. More particularly, example embodiments relate to a semiconductor package in which a plurality of different chips are stacked on a package substrate and a method of manufacturing the same.

2. Description of the Related Art

In a multi-chip package including a plurality of stacked semiconductor chips, as the number of the semiconductor chips for high capacity and high performance increases, a thickness of the entire package may be reduced by reducing a thickness of the semiconductor chips. However, the stacked semiconductor chips may warp due to their thin thickness, which may lead to deteriorating leakage current characteristics.

SUMMARY

Example embodiments provide a semiconductor package having a relatively thin thickness and high reliability.

Example embodiments provide a method of manufacturing the semiconductor package.

According to example embodiments, a semiconductor package includes a package substrate, a chip stack structure on the package substrate, the chip stack structure including a base chip having a first thickness and a plurality of upper chips sequentially stacked on the base chip, wherein the plurality of upper chips each have a second thickness smaller than the first thickness, and a sealing member on an upper surface of the package substrate and on the chip stack structure. At least one of the plurality of upper chips includes a substrate having opposite first and second surfaces, a circuit layer on the first surface, and a stress compensation layer on the second surface, wherein the stress compensation layer has an internal stress that offsets a warpage of the chip substrate.

According to example embodiments, a semiconductor package includes a package substrate, a semiconductor chip on an upper surface of the package substrate, a support spacer on the upper surface of the package substrate and spaced apart from the semiconductor chip, a chip stack structure on the semiconductor chip and the support spacer, the chip stack structure including a base chip having a first thickness and a plurality of upper chips sequentially stacked on the base chip, wherein the plurality of upper chips each have a second thickness smaller than the first thickness, and a sealing member on the upper surface of the package substrate, on the semiconductor chip, on the support spacer, and on the stack structure. Each of the plurality of upper chips includes, a substrate having opposite first and second surfaces, a circuit layer on the first surface, and a stress compensation layer on the second surface and having an internal stress that offsets an internal stress of the chip substrate.

According to example embodiments, in a method of manufacturing a semiconductor package, a first wafer having a first thickness is provided. A second wafer having a second thickness less than the first thickness is provided. The first wafer is diced to form a base chip. A stress compensation layer is formed on a backside surface of the second wafer, the stress compensation layer having an internal stress selected to offset an internal stress within the second wafer. The second wafer is diced to form a plurality of upper chips. The base chip is attached to an upper surface of a package substrate. The plurality of upper chips are sequentially stacked on the base chip. A sealing member is formed on the upper surface of the package substrate, on the base chip, and on the plurality of upper chips.

According to example embodiments, a semiconductor package may include a chip stack structure on a package substrate. The chip stack structure may include a plurality of semiconductor chips sequentially stacked. A lowermost one of the plurality of semiconductor chips has a first thickness, and each of the upper chips sequentially stacked on the lowermost one of the plurality of semiconductor chips has a second thickness smaller than the first thickness. In addition, each of the upper chips may include a stress compensation layer formed on an inactive surface of a substrate of each of the upper chips.

The stress compensation layer may have an internal stress such as tensile stress or compressive stress. The stress compensation layer may reduce warpage of the relatively thin upper chip. Accordingly, bending of the upper chips having a very thin thickness may be prevented to thereby improve leakage current characteristics of devices in a circuit layer of each of the upper chips.

BRIEF DESCRIPTION OF THE DRAWINGS

Example embodiments will be more clearly understood from the following detailed description taken in conjunction with the accompanying drawings.

FIG. 1 is a cross-sectional view illustrating a semiconductor package in accordance with example embodiments.

FIG. 2 is an enlarged cross-sectional view illustrating portion 'A' in FIG. 1.

FIGS. 3 to 15 are views illustrating a method of manufacturing a semiconductor package in accordance with example embodiments.

FIG. 16 is a cross-sectional view illustrating a semiconductor package in accordance with example embodiments.

FIG. 17 is an enlarged cross-sectional view illustrating portion 'B' in FIG. 16.

DETAILED DESCRIPTION OF EXAMPLE EMBODIMENTS

Hereinafter, example embodiments will be explained in detail with reference to the accompanying drawings.

Figure 1:
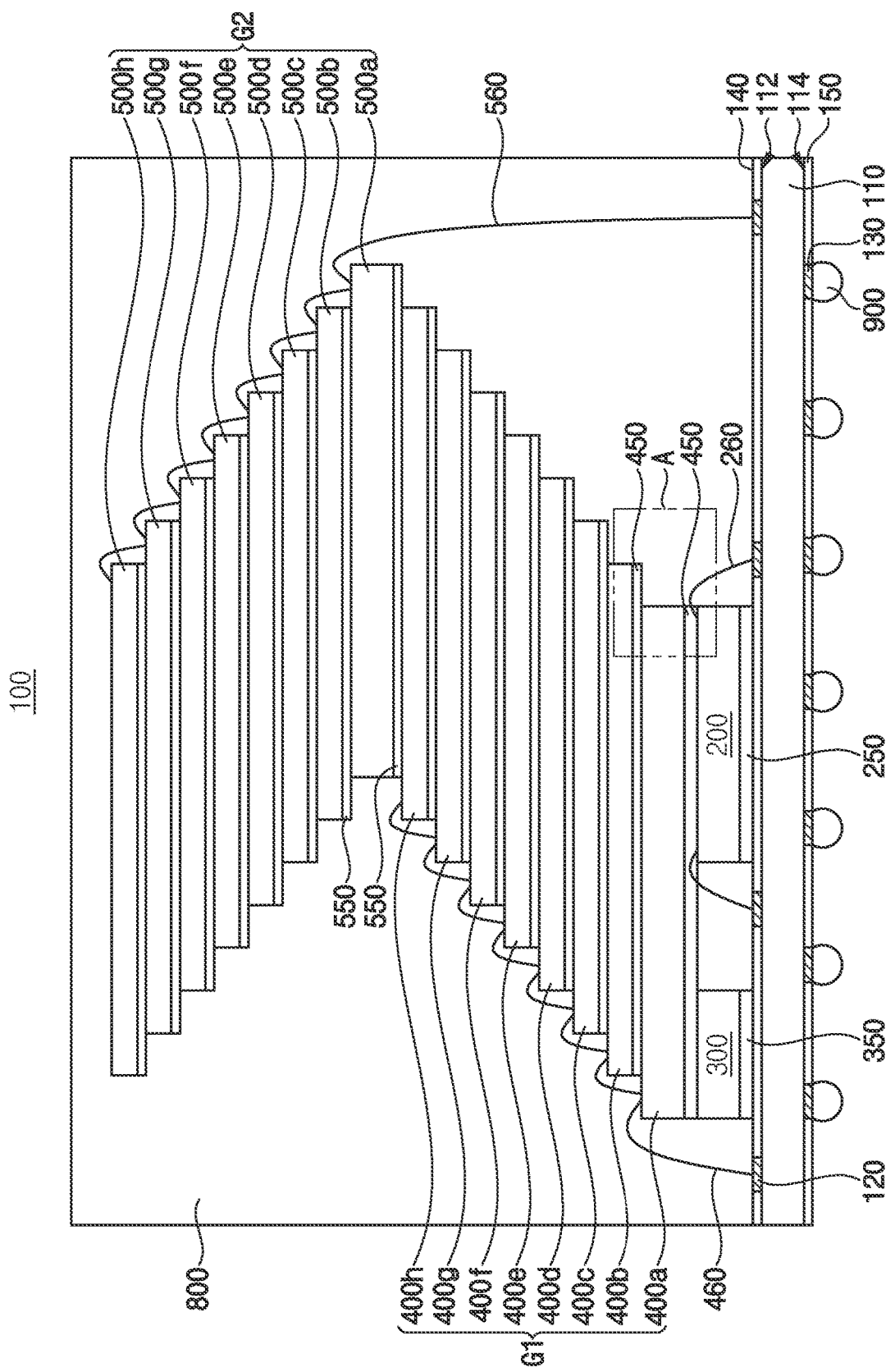
FIGS. 1 to 17 represent non-limiting, example embodiments as described herein.
Figure 2:
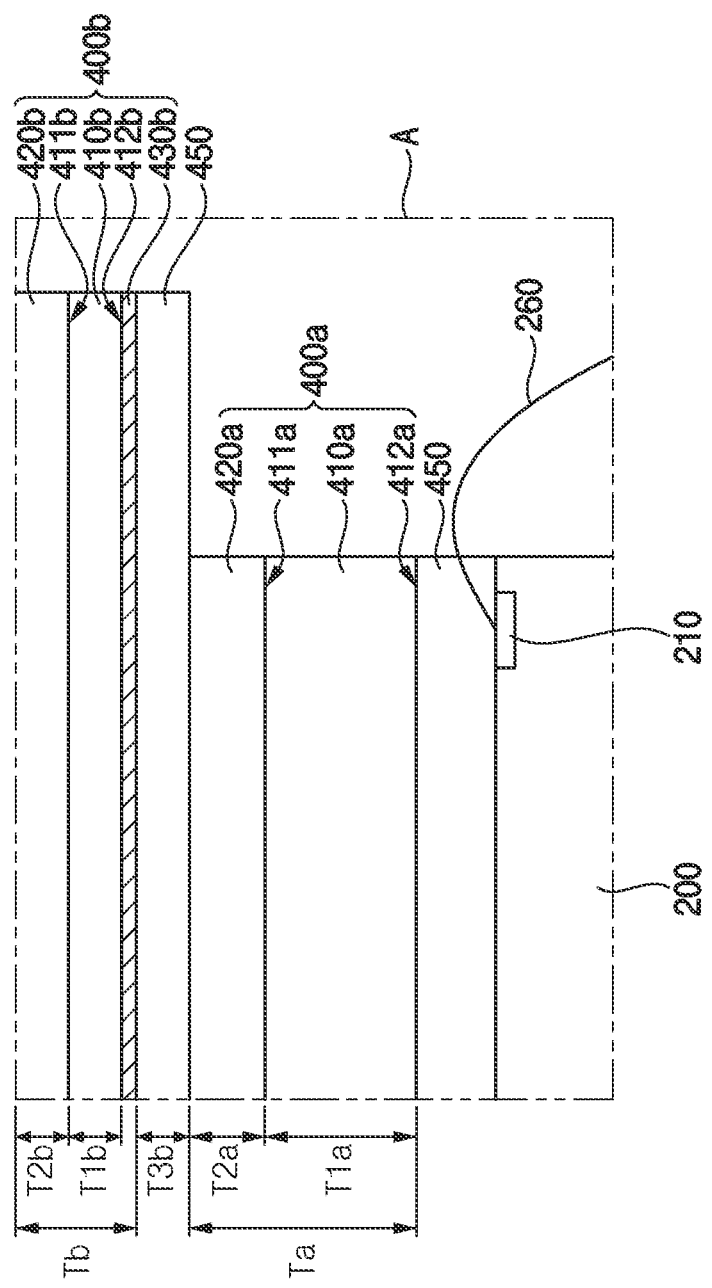

FIG. 1 is a cross-sectional view illustrating a semiconductor package in accordance with example embodiments. FIG. 2 is an enlarged cross-sectional view illustrating portion 'A' in FIG. 1.

Referring to FIGS. 1 and 2, a semiconductor package 100 may include a package substrate 110, a first semiconductor chip 200, a support spacer 300, first and second chip stack structures G1 and G2 including a plurality of semiconductor chips respectively, and a molding or sealing member 800. Additionally, the semiconductor package 100 may further include external connection members 900.

In example embodiments, the semiconductor package 100 may be a multi-chip package (MCP) including different types of semiconductor chips. The semiconductor package 100 may be a system in package (SIP) where a plurality of semiconductor chips may be stacked or arranged in one package to provide one independent function.

The package substrate 110 may be a substrate having an upper surface 112 and a lower surface 114 opposite to each other. For example, the package substrate 100 may include a printed circuit board (PCB), a flexible substrate, a tape substrate, or the like. The package substrate may be a multilayer circuit board having vias and various circuits therein. The package substrate 110 may include internal wirings as channels for electrical connection between the first semiconductor chip 200 and the memory chips.

Substrate pads 120 may be disposed on the upper surface 112 of the package substrate 110. The substrate pads 120 may be respectively connected to the internal wirings. The wirings may extend from the upper surface 112 or the inside of the package substrate 110. For example, at least a portion of the wiring may use the substrate pad 120 as a landing pad.

Although only a few substrate pads are illustrated in the drawings, it will be understood that the number and arrangement of the substrate pads 120 are provided by way of example, and it may not be limited thereto. Since the wirings, including the substrate pads 120, are well known in related art to which the present invention pertains, the illustration and description thereof will be omitted.

A first insulating layer 140 may be provided on the upper surface 112 of the package substrate 110 to expose the substrate pads 120. The first insulating layer 140 may cover the entire upper surface 112 of the package substrate 110 except for the substrate pads 120. For example, the first insulating layer may include a solder resist.

In example embodiments, the first semiconductor chip 200 may be mounted on the package substrate 110. The first semiconductor chip 200 may be attached on the upper surface 112 of the package substrate 110 using an adhesive member 250. For example, the adhesive member may include an adhesive film such as a direct adhesive film (DAF). The first semiconductor chip 200 may include an integrated circuit. For example, the first semiconductor chip 200 may be a logic chip including a logic circuit. The logic chip may be a controller that controls memory chips. The semiconductor chip may be a processor chip such as an ASIC as a host such as a CPU, GPU, or SoC.

The first semiconductor chip 200 may have chip pads 210 formed on an upper surface, that is, an active surface thereof. The first semiconductor chip may be mounted on the package substrate 110 such that an inactive surface opposite to the active surface on which the chip pads are formed faces the package substrate 110. The chip pads may include an input/output terminal that performs a power pin function, an input/output terminal that performs a ground pin function, or an input/output terminal that performs a data pin function.

The first semiconductor chip 200 may be electrically connected to the package substrate 110 by first conductive connection members 260. Particularly, the first conductive connection member 260 may electrically connect the chip pad 210 of the first semiconductor chip 200 to the substrate pad 120 of the package substrate 110. For example, the first conductive connection member 260 may include a bonding wire. Accordingly, the first semiconductor chip 200 may be stacked on the package substrate 110 by the adhesive member and may be electrically connected to the package substrate 110 through a plurality of the first conductive connection members 260.

For example, a thickness of the first semiconductor chip may be within a range of about 40 μm to 60 μm, and a thickness of the adhesive member may be within a range of about 15 μm to 25 μm. In this embodiment, the thickness of the semiconductor chip may be about 50 μm, and the thickness of the adhesive member may be about 20 μm.

Alternatively, the first conductive connection member may include a solder bump, a through electrode, a solder ball, a conductive paste, or the like. For example, the first semiconductor chip may be mounted on the package substrate 110 in a flip chip bonding manner. In this case, the first semiconductor chip 200 may be mounted on the package substrate 110 such that the active surface on which the chip pads are formed faces the package substrate 110. The chip pads of the first semiconductor chip 200 may be electrically connected to the substrate pads of the package substrate 110 by conductive bumps, for example, solder bumps. Additionally, a plurality of the first semiconductor chips may be sequentially stacked on the package substrate 110.

In example embodiments, the support spacer 300 may be disposed on the package substrate 110 to be spaced apart from the first semiconductor chip 200, as illustrated in FIG. 1. The support spacer 300 may be attached on the upper surface 112 of the package substrate 110 using an adhesive member 350. The support spacer 300 may be disposed between the package substrate 110 and other electronic components to support other electronic components.

For example, the adhesive film 350 may include a die adhesive film (DAF). The support spacer 300 may be attached on the upper surface 112 of the package substrate 110 using the adhesive film 350 by a die attach process.

For example, the support spacer 300 may have a thickness of about 50 μm to about 300 μm. Additionally, upper surfaces of the first semiconductor chip 200 and the support spacer 300 may be substantially at the same horizontal level.

In example embodiments, the first chip stack structure G1 may be stacked on the first semiconductor chip 200 and the support spacers 300 on the package substrate 110. The first chip stack structure G1 may include a plurality of semiconductor chips 400a, 400b, 400c, 400d, 400e, 400f, 400g and 400h sequentially stacked on the semiconductor chip 200. For example, the semiconductor chip may include a memory chip such as a non-volatile memory device, e.g., DRAM or NAND flash memory.

The first chip stack structure G1 may include second semiconductor chips 400a, 400b, 400c, 400d, 400e, 400f, 400g and 400h of the same type. The second semiconductor chips 400a, 400b, 400c, 400d, 400e, 400f, 400g and 400h may be sequentially attached on the first semiconductor chip 200 and the support spacer 300 using adhesive members 450. Each of the plurality of second semiconductor chips 400a, 400b, 400c, 400d, 400e, 400f, 400g and 400h may be arranged such that a backside surface (inactive surface) opposite to an active surface on which chips pads of each chip are formed faces the package substrate 110.

The second semiconductor chips 400a, 400b, 400c, 400d, 400e, 400f, 400g and 400h may be stacked in a first cascade structure, as illustrated in FIG. 1. The plurality of second semiconductor chips 400b, 400c, 400d, 400e, 400f, 400g and 400h may be sequentially offset-aligned in a first lateral direction (right direction) of the package substrate 110, as illustrated in FIG. 1. For example, the adhesive member may include an adhesive film such as a direct adhesive film (DAF). The second semiconductor chips may have a larger area than the first semiconductor chip 200. Accordingly, the first semiconductor chip 200 may have a structure (overhang portion) thereon that extends outwardly from one or more sides of the first semiconductor chip 200.

The second semiconductor chips 400a, 400b, 400c, 400d, 400e, 400f, 400g and 400h may be electrically connected to the package substrate 110 by second conductive connection members 460. Specifically, the second conductive connection members 460 may electrically connect the chip pads of the plurality of second semiconductor chips to the substrate pads 120 of the package substrate 110. For example, the second conductive connection members 460 may include a bonding wire. Accordingly, the plurality of second semiconductor chips 400a-400h may be electrically connected to the package substrate 110 by a plurality of the second conductive connection members 460.

It will be understood that the number, size, and arrangement of the first semiconductor chip 200, the support spacer 300, and the second semiconductor chips 400a-400h are provided as examples, and it may not be limited thereto. In addition, the type and number of the second semiconductor chips 400a-400h of the first chip stack structure G1 may not be limited thereto.

In example embodiments, a thickness Ta (FIG. 2) of the lowermost second semiconductor chip 400a, that is, a base chip, among the plurality of second semiconductor chips may be greater than a thickness Tb (FIG. 2) of at least one of upper chips 400b, 400c, 400d, 400e, 400f, 400g and 400h stacked on the base chip 400a. An area of the lowermost second semiconductor chip 400a may be greater than an area of the first semiconductor chip 200. Since the lowermost second semiconductor chip 400a has a relatively large thickness compared to the other second semiconductor chips 400b-400h, it may be possible to prevent cracks from occurring in the lowermost second semiconductor chip 400a.

As illustrated in FIG. 2, the base chip 400a may include a substrate 410a having a first surface 411a and a second surface 412a opposite to each other and a circuit layer 420a formed on the first surface 411a of the substrate 410a. For example, the circuit layer 420a may include a mold layer in which cells are formed to be vertically stacked, a metal wiring layer formed on the mold layer, etc. In addition, the chip pads for electrical connection may be formed on an outer surface of the circuit layer 420a. The base chip 400a may have a first thickness Ta within a range of about 40 µm to 400 µm. The substrate 410a of the base chip 400a has a thickness T1a within a range of about 30 µm to 350 µm, and the circuit layer 420a of the base chip 400a has a thickness T2a within a range of about 15 µm to 35 µm.

The upper chip 400b stacked on the base chip 400a may include a substrate 410b having a first surface 411b and a second surface 412b opposite to each other, a circuit layer 420b formed on the first surface 411b of the substrate 410b, and a stress compensation layer 430b formed on the second surface 411b of the substrate 410b. For example, the upper chip 400b may have a second thickness Tb of about 15 µm to 40 µm. The substrate 410b of the upper chip 400b has a thickness T1b within a range of about 5 µm to 15 µm, the circuit layer 420b of the upper chip 400b has a thickness T2b within a range of about 15 µm to 35 µm, and the stress compensation layer 430b of the upper chip 400b may have a thickness T3b within a range of about 0.01 µm to 1 µm.

The plurality of upper chips 400c, 400d, 400e, 400f, 400g and 400h may be substantially the same as the upper chip 400b of FIG. 2. Each of the upper chips sequentially stacked on the base chip 400a may include a stress compensation layer formed on the second surface of the substrate. For example, the stress compensation layer may include silicon oxide ($SiO_2$), silicon nitride (SiN), silicon oxynitride (SiON), or the like.

The stress compensation layer 430b may be formed on the entire second surface 412b of the substrate 410b. The stress compensation layer 430b may have an internal stress such as tensile stress or compressive stress, for example, as a result of a tensile force or a compressive force applied to or created in the stress compensation layer 430b during formation. Due to the internal stress, the stress compensation layer 430b may have a warpage with a positive value or a negative value. For example, the stress compensation layer 430b may be warped in a first direction, e.g., upwardly, or may be warped in a second direction, e.g., downwardly, opposite to the first direction. The stress compensation layer 430b may offset or compensate for the stress of the substrate 410b by having a warpage that offsets the warpage of the substrate 410b. The internal stress of the stress compensation layer may be within a range of ±10 MP to ±1,000 MPa.

In example embodiments, the second chip stack structure G2 may be disposed on the first chip stack structure G1, as illustrated in FIG. 1. The second chip stack structure G2 includes a plurality of third semiconductor chips 500b, 500c, 500d, 500e, 500f, 500g and 500h sequentially stacked on the uppermost second semiconductor chip 400h of the first chip stack structure G1. For example, the third semiconductor chip may include a memory chip such as a non-volatile memory device such as a DRAM or a NAND flash memory. The type and number of the memory chips of the second chip stack structure G2 may not be limited thereto.

The second chip stack structure G2 may include third semiconductor chips 500a, 500b, 500c, 500d, 500e, 500f, 500g and 500h of the same type. The third semiconductor chips 500a, 500b, 500c, 500d, 500e, 500f, 500g and 500h may be sequentially attached on the package substrate 110 using adhesive members 550. Each of the plurality of third semiconductor chips 500a, 500b, 500c, 500d, 500e, 500f, 500g and 500h may be disposed on the package substrate 110 such that a backside surface opposite to a front surface on which chip pads are formed faces the package substrate 110.

The third semiconductor chips 500a, 500b, 500c, 500d, 500e, 500f, 500g and 500h may be stacked in a second cascade structure, as illustrated in FIG. 1. The plurality of third semiconductor chips 500b, 500c, 500d, 500e, 500f, 500g and 500h may be sequentially offset-aligned in a second lateral direction (left direction) of the package substrate 110. For example, the adhesive member may include an adhesive film such as a direct adhesive film (DAF).

The third semiconductor chips 500a, 500b, 500c, 500d, 500e, 500f, 500g and 500h may be electrically connected to the package substrate 110 by third conductive connection members 560. Specifically, the third conductive connection members 560 may electrically connect the chip pads of the plurality of third semiconductor chips to the substrate pads 120 of the package substrate 110. For example, the third conductive connection members 560 may include a bonding wire. Accordingly, the plurality of third semiconductor chips may be electrically connected to the package substrate 110 by the plurality of third conductive connection members 560.

The lowermost third semiconductor chip 500a among the plurality of third semiconductor chips may be substantially the same as or similar to the base chip 400a of FIG. 2. The plurality of upper chips 500b, 500c, 500d, 500e, 500f, 500g and 500h may be substantially the same as or similar to the upper chip 400b of FIG. 2.

In example embodiments, a thickness of the lowermost third semiconductor chip 500a, that is, the base chip, among the plurality of third semiconductor chips, may be greater than a thickness of at least one of the upper chips 500b, 500c, 500d, 500e, 500f, 500g and 500h stacked on the base chip 500b.

Each of the upper chips 500b, 500c, 500d, 500e, 500f, 500g and 500h sequentially stacked on the base chip 500a may include a stress compensation layer formed on the second surface of the substrate, as described above with respect to stress compensation layer 430b. The stress compensation layer may have an internal stress such as tensile stress or compressive stress. Due to the internal stress, the stress compensation layer may have a warpage with a positive value or a negative value. The stress compensation layer may compensate for the stress of the substrate to provide a warpage capable of offsetting the warpage of the substrate.

In example embodiments, the sealing member 800 may be formed on the package substrate 110 to protect the first semiconductor chip 200, the first chip stack structure G1 and the second chip stack structure G2 from the outside. The sealing member may include an epoxy mold compound (EMC).

External connection pads 130 for providing electrical signals may be provided on the lower surface 114 of the package substrate 110. The external connection pads 130 may be exposed by a second insulating layer 150. The second insulating layer may include a silicon oxide layer, a silicon nitride layer, or a silicon oxynitride layer. An external connection member 900 may be disposed on the external connection pad 130 of the package substrate 110 for electrical connection with an external device. For example, the external connection member 900 may be a solder ball. The semiconductor package 100 may be mounted on a module substrate (not shown) via the solder balls to provide a memory module.

As mentioned above, the semiconductor package 100 may include the first chip stack structure G1 disposed on the package substrate 100. The first chip stack structure G1 may include the plurality of second semiconductor chips 400a, 400b, 400c, 400d, 400e, 400f, 400g and 400h sequentially stacked. Among the plurality of second semiconductor chips, the lowermost second semiconductor chip 400a, that is, the base chip, may have the first thickness Ta, and the upper chips 400b, 400c, 400d, 400e, 400f, 400g and 400h sequentially stacked on the base chip may have the second thickness Tb smaller than the first thickness Ta. In addition, each of the upper chips 400b, 400c, 400d, 400e, 400f, 400g and 400h may include the stress compensation layer 430b formed on the second surface 412b of the substrate 410b.

The stress compensation layer may have an internal stress such as tensile stress or compressive stress. The stress compensation layer may reduce warpage of the relatively thin upper chip. Accordingly, bending of the upper chips having a very thin thickness may be prevented, to thereby improve leakage current characteristics of devices in the circuit layer of each of the upper chips.

Hereinafter, a method of manufacturing the semiconductor package of FIG. 1 will be described.

Figure 6:
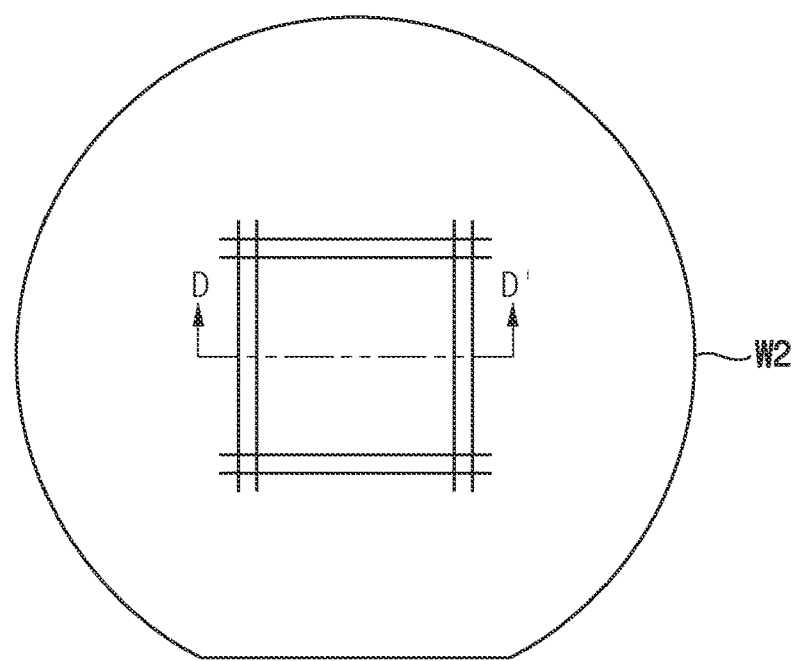
Figure 7:
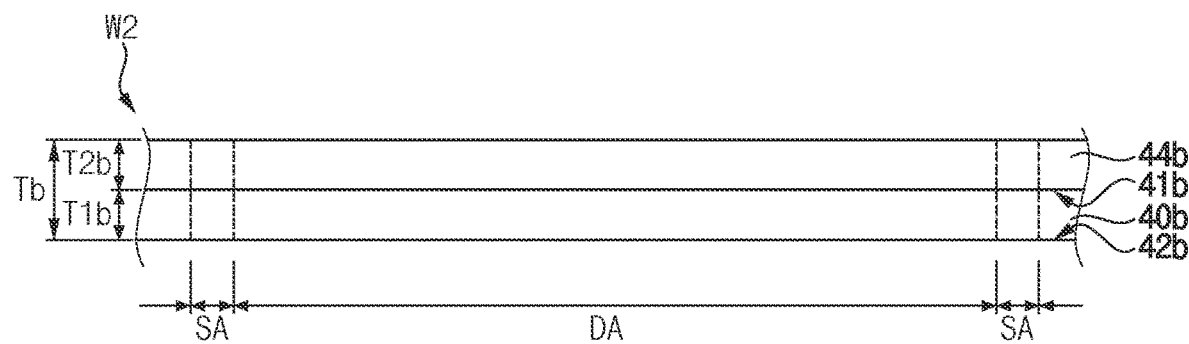

FIGS. 3 to 15 are views illustrating a method of manufacturing a semiconductor package in accordance with example embodiments. FIG. 4 is a cross-sectional view taken along the line C-C' in FIG. 3. FIG. 7 is a cross-sectional view taken along the line D-D' in FIG. 6.

Figure 3:
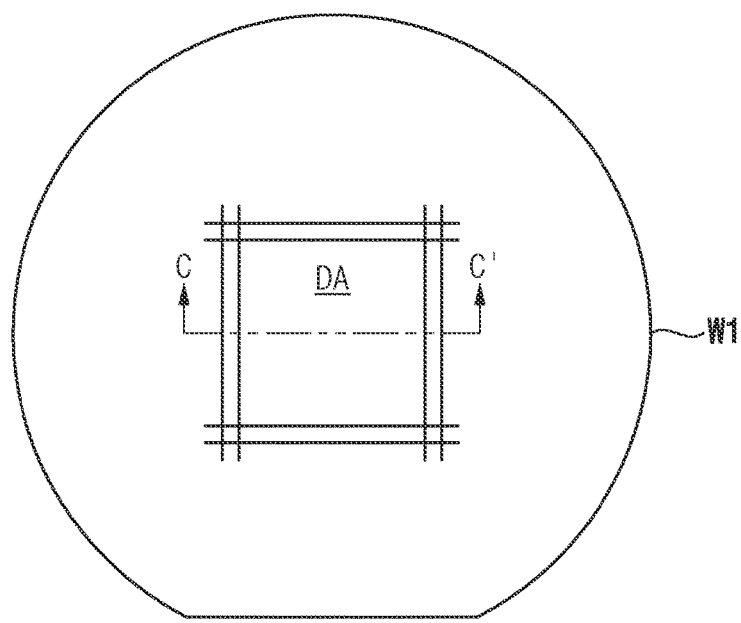
Figure 4:
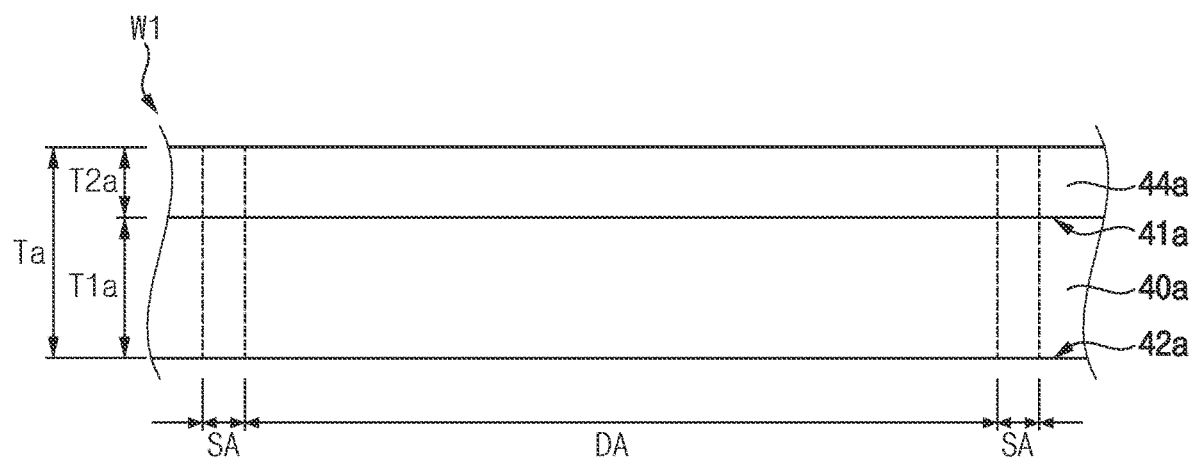
Figure 5:
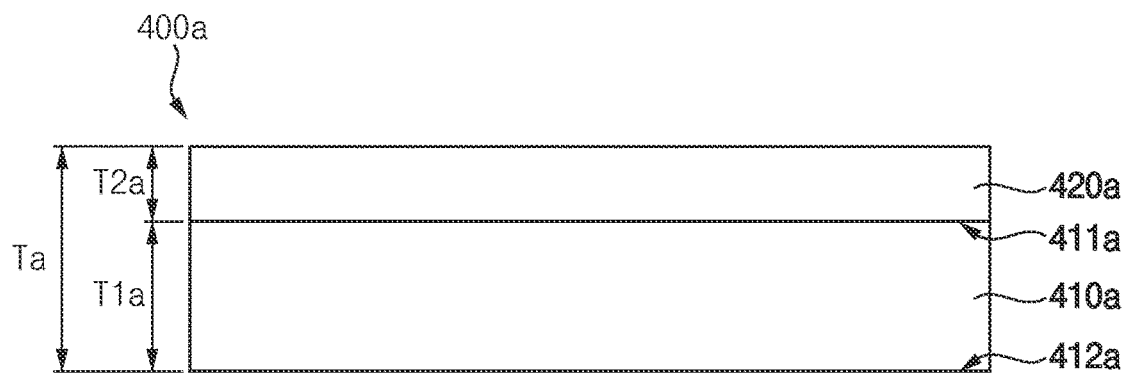

Referring to FIGS. 3 to 5, a first wafer W1 may be sawed to form individual base chips 400a having a first thickness Ta.

In example embodiments, after a backside surface of the first wafer W1 is removed by a polishing process to have a first thickness Ta, the first silicon wafer W1 may be cut by a dicing process to form individual base chips 400a. For example, the first wafer W1 may be polished to have the first thickness Ta of about 40 μm to 400 μm.

As illustrated in FIG. 4, the first wafer W1 my including a substrate 40a having a first surface 41a and a second surface 42a opposite to each other and a circuit layer 44a formed on the first surface 41a of the substrate 40a. For example, the first wafer W1 may include memory dies such as VNAND. The circuit layer 44a may include a mold layer in which cells are formed to be vertically stacked and a metal wiring layer formed on the mold layer, etc. Additionally, chip pads for electrical connection may be formed in an outer surface of the circuit layer 44a. The substrate 40a may have a thickness T1a within a range of about 30 μm to 350 μm, and the circuit layer 44a may have a thickness T2a within a range of about 15 μm to 35 μm.

The first wafer W1 may include a die region DA in which circuit patterns and cells are formed and a scribe lane region SA surrounding the die area DA. The first wafer W1 may be cut along the scribe lane region SA dividing a plurality of the die regions DA by a dicing process to be divided into the individualized base chips.

For example, the first wafer W1 may include a semiconductor material, e.g., silicon, germanium, silicon-germanium, or the like, or III-V compounds, e.g., gallium phosphide (GaP), gallium arsenide (GaAs), gallium antimonide (GaSb), or the like. In some embodiments, the first wafer W1 may be a silicon-on-insulator (SOI) substrate or a germanium-on-insulator (GOI) substrate.

As illustrated in FIG. 5, the base chip 400a singulated by the dicing process may include a substrate 410a having a first surface 411a and a second surface 412a opposite to each other, and a circuit layer 420a provided on the first surface 411a of the substrate 410a. As will be described later, the base chip 400a may be used as a lowermost memory chip among a plurality of memory chips stacked on a package substrate.

As illustrated in FIGS. 6 to 10, a second wafer W2 may be cut to form individual chips 400b having a second thickness Tb.

As illustrated in FIG. 7, a backside surface of the second wafer W2 may be removed by a polishing process to have the second thickness Tb. For example, the second wafer W2 may be polished to have the second thickness Tb of about 15 μm to 40 μm.

Similar to the first wafer W1, the second wafer W2 may include a substrate 40b having a first surface 41b and a second surface 42b opposite to each other and a circuit layer 44b formed on the first surface 41b of the substrate 40b. For example, the second wafer W2 may include memory dies such as VNAND. The circuit layer 44b may include a mold layer in which cells are formed to be vertically stacked, and a metal wiring layer formed on the mold layer, etc. Additionally, chip pads for electrical connection may be formed in an outer surface of the circuit layer 44b. The substrate 40b may have a thickness T1b within a range of about 5 μm to 15 μm, and the circuit layer 44b may have a thickness T2b within a range of about 15 μm to 35 μm.

Figure 8:
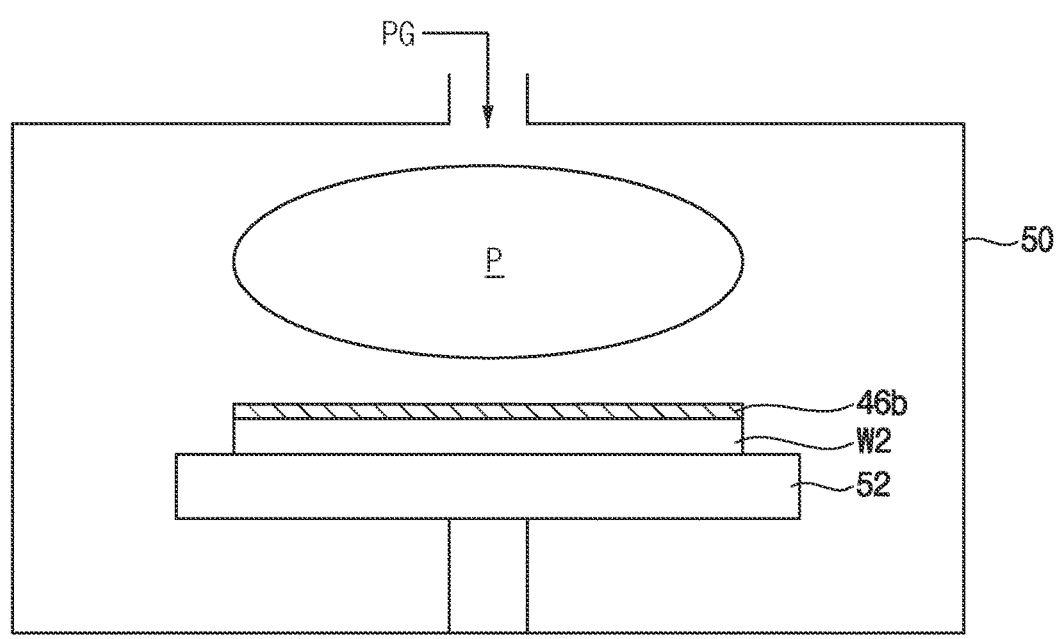
Figure 9:
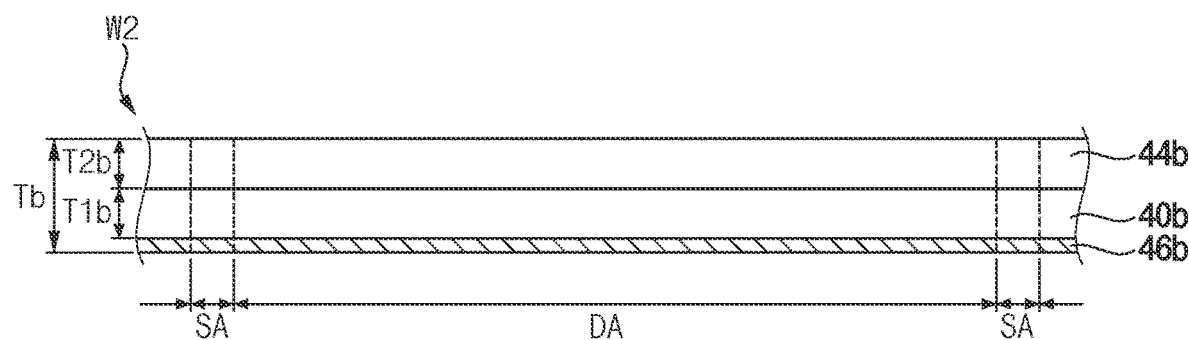

As illustrated in FIGS. 8 and 9, a stress compensation layer 46b having an internal stress for preventing warpage of the substrate may be formed on the polished backside surface of the second wafer W2, that is, the second surface 42b of the substrate 40b.

For example, a sputtering process may be performed on the second surface 42b of the second wafer W2 to form the stress compensation layer 46b. After the second wafer W2 is loaded on a substrate stage 52 in a plasma chamber 50, a process gas PG such as Argon (Ar) may be supplied onto the wafer to perform a sputtering process. A modified layer as the stress compensation layer may be formed on the silicon surface by collision of argon ions (Ar+). The stress compensation layer 46b may include silicon oxide ($SiO_2$).

Alternatively, a plasma enhanced chemical vapor deposition (PECVD) process may be performed on the second surface 42b of the second wafer W2 to form the stress compensation layer 46b. After the second wafer W2 is loaded on the substrate stage 52 in the plasma chamber 50, a process gas PG including a precursor, which is a polymer compound, may be supplied onto the substrate to perform a plasma deposition process. A modified layer as the stress compensating layer may be formed by vaporizing the polymer compound and applying plasma power into the plasma chamber. The stress compensation layer 46b may include silicon nitride (SiN), silicon oxynitride (SiON), etc.

The stress compensation layer 46b may have a thickness T3b within the range of about 0.01 μm to 1 μm. The stress compensation layer 46b may be formed on the entire second surface 42b of the second wafer W2. The stress compensation layer 46b may have an internal stress such as tensile stress or compressive stress. For example, the stress compensation layer 46b may be warped in a first direction, e.g., upwardly, or may be warped in a second direction, e.g., downwardly, opposite to the first direction. Due to the internal stress, the stress compensation layer 46b may have a warpage with a positive value or a negative value. An amount of the warpage may be controlled through process conditions such as plasma power applied in the plasma chamber. The stress compensating layer 46b may compensate the stress to have an opposite warpage capable of offsetting the warpage of the substrate 40b.

Figure 10:
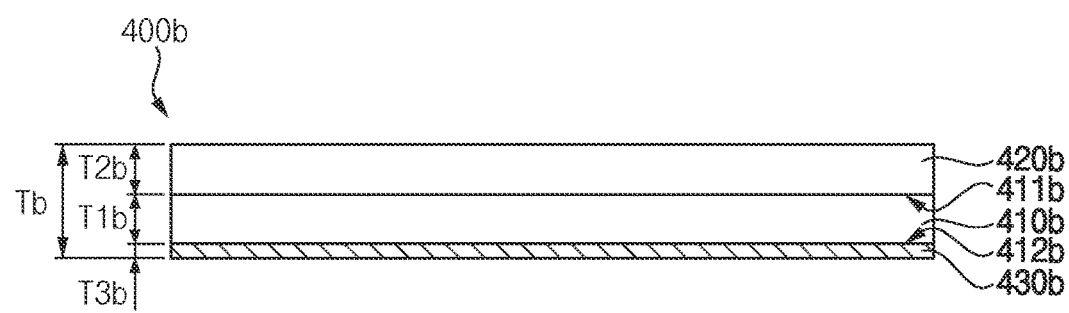

Then, as illustrated in FIG. 10, the second wafer W2 may be cut by a dicing process to form the individual chips 400b. As will be described later, the chip 400b may be used as an upper memory chip stacked on the lowermost memory chip among the plurality of memory chips.

Figure 11:
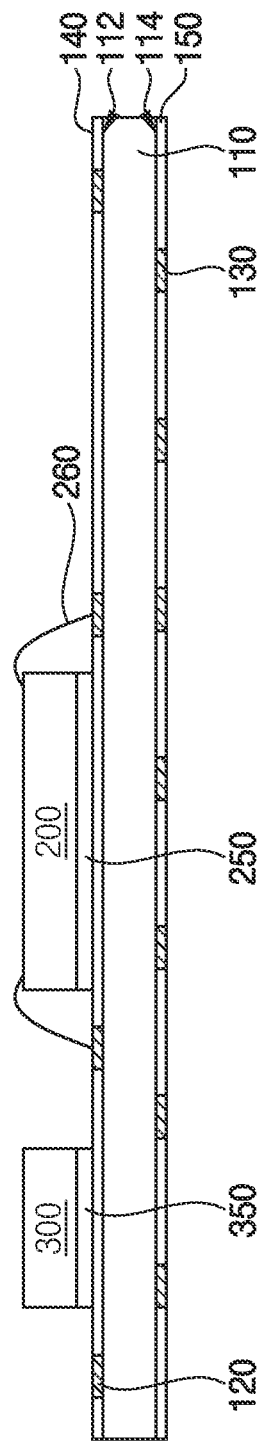

Referring to FIG. 11, a first semiconductor chip 200 and at least one support spacer 300 may be stacked on a package substrate 110.

In example embodiments, the package substrate 110 may be a substrate having an upper surface 112 and a lower surface 114 opposite to each other. For example, the package substrate 110 may be a printed circuit board (PCB). The printed circuit board may be a multilayer circuit board having vias and various circuits therein.

The first semiconductor chip 200 may be attached to the upper surface 112 of the package substrate 110 using an adhesive film 250. The first semiconductor chip 200 may be a logic chip including a logic circuit. The logic chip may be a controller that controls memory chips. For example, the adhesive film 250 may include a die adhesive film (DAF). The first semiconductor chip 200 may be attached on the upper surface 112 of the package substrate 110 using the adhesive film 250 by a die attach process.

Then, a wire bonding process may be performed to connect chip pads of the first semiconductor chip 200 to substrate pads 120 on the upper surface 112 of the package substrate 110. The chip pads of the first semiconductor chip 200 may be connected to the substrate pads 120 by first conductive connection members 260. The first conductive connection members may include bonding wires.

Then, the support spacer 300 may be attached to the upper surface 112 of the package substrate 110 to be spaced apart from the first semiconductor chip 200 using an adhesive film 350. A plurality of the support spacers may be positioned adjacent to the first semiconductor chip 200.

For example, the adhesive film 350 may include a die adhesive film (DAF). The support spacer 300 may be attached on the upper surface 112 of the package substrate 110 using the adhesive film 350 by a die attach process. Upper surfaces of the first semiconductor chip 200 and the support spacer 300 may be substantially at the same horizontal level.

Figure 12:
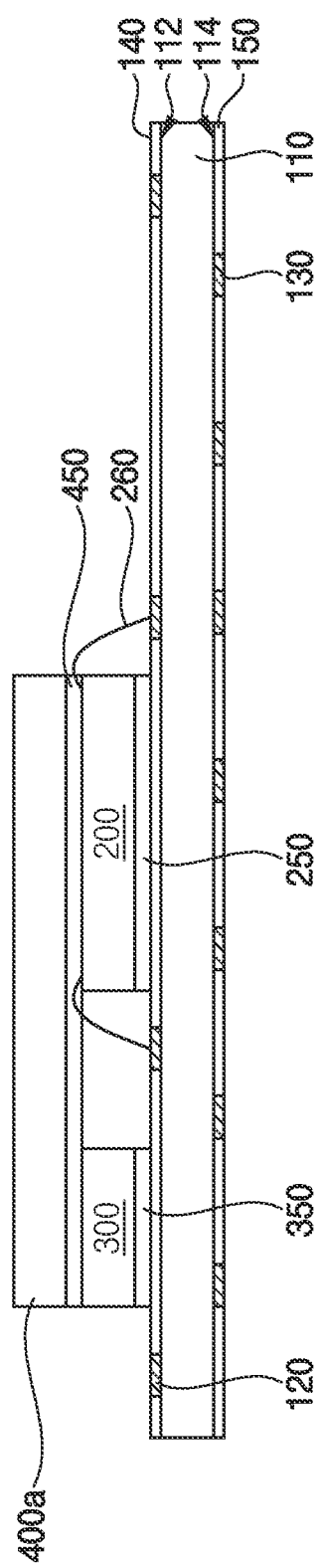
Figure 13:
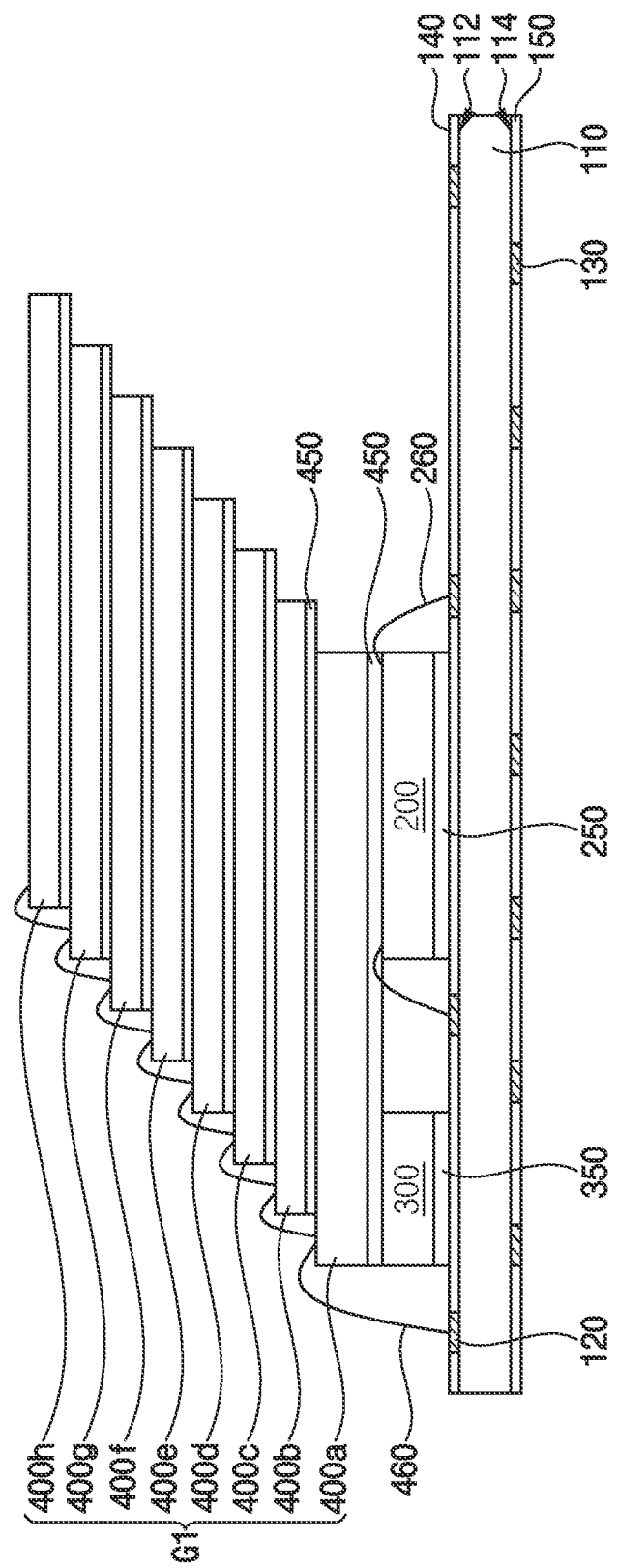

Referring to FIGS. 12 and 13, a first chip stack structure G1 including a plurality of semiconductor chips 400a, 400b, 400c, 400d, 400e, 400f, 400g and 400h may be stacked on the first semiconductor chip 200 and the support spacer 300.

As illustrated in FIG. 12, the base chip 400a of FIG. 5 may be stacked on the first semiconductor chip 200 and the support spacer 300. The base chip 400a may be a lowermost semiconductor chip among the plurality of semiconductor chips. The base chip 400a may be attached on the first semiconductor chip 200 and the support spacer 300 using an adhesive member 450 such as a DAF. A planar area of the base chip may be greater than a planar area of the first semiconductor chip or the support spacer.

The base chip 400a may be disposed on the package substrate 110 such that the second surface 412a of the substrate 410a faces the package substrate 110. The chip pads of the base chip 400a may be provided on the circuit layer 420a on the first surface 41aa of the substrate 410a.

Then, as illustrated in FIG. 13, a plurality of upper chips 400b, 400c, 400d, 400e, 400f, 400g and 400h may be sequentially stacked on the base chip 400a. The plurality of upper chips 400c, 400d, 400e, 400f, 400g and 400h may be substantially the same as the chip 400b of FIG. 10. The type and number of the memory chips of the first chip stack structure G1 may not be limited thereto.

The chip 400b of FIG. 10 may be disposed on the package substrate 110 such that the second surface 412b of the substrate 410b faces the package substrate 110. The chip pads of the chip 400b may be provided on the circuit layer 420b on the first surface 411b of the substrate 410b. Similarly, each of the plurality of upper chips 400c, 400d, 400e, 400f, 400g and 400h may be disposed on the package substrate 110 such that the second surface of each substrate faces the package substrate 110.

The plurality of chips may be sequentially offset-aligned. For example, the plurality of upper chips 400b, 400c, 400d, 400e, 400f, 400g and 400h may be stacked in a first cascade structure, as illustrated in FIG. 13. The plurality of upper chips 400b, 400c, 400d, 400e, 400f, 400g and 400h may be sequentially offset-aligned in a first lateral direction (right direction) of the package substrate 110, as illustrated in FIG. 13. The plurality of upper chips 400b, 400c, 400d, 400e, 400f, 400g and 400h may be attached on the base chip 400a using the adhesive film 450 such as a DAF. For example, the upper chip 400b is attached to the base chip 400a using an adhesive film 450, and the upper chips 400b-400h are attached together via a respective adhesive film 450 between adjacent ones of the upper chips 400b-400h.

Then, a wire bonding process may be performed to connect the chip pads of the base chip 400a and the plurality of chips 400b, 400c, 400d, 400e, 400f, 400g and 400h to the substrate pads 120 on the upper surface 112 of the package substrate 110. The chip pads of the first semiconductor chips 400a, 400b, 400c, 400d, 400e, 400f, 400g and 400h of the first chip stack structure G1 may be connected to the substrate pads 120 by second conductive connection members 460, i.e., bonding wires.

Thicknesses of the upper chips 400b-400h may be smaller than a thickness of the base chip 400a. One or more of the upper chips 400b-400h may include a respective stress compensation layer 430b formed on the backside surface of the substrate 410b, that is, the second surface. The stress compensation layer 430b may reduce warpage of the relatively thin upper chip. Accordingly, it may be possible to improve leakage current characteristics of devices in the circuit layer of each of the stacked upper chips 400b-400h.

Figure 14:
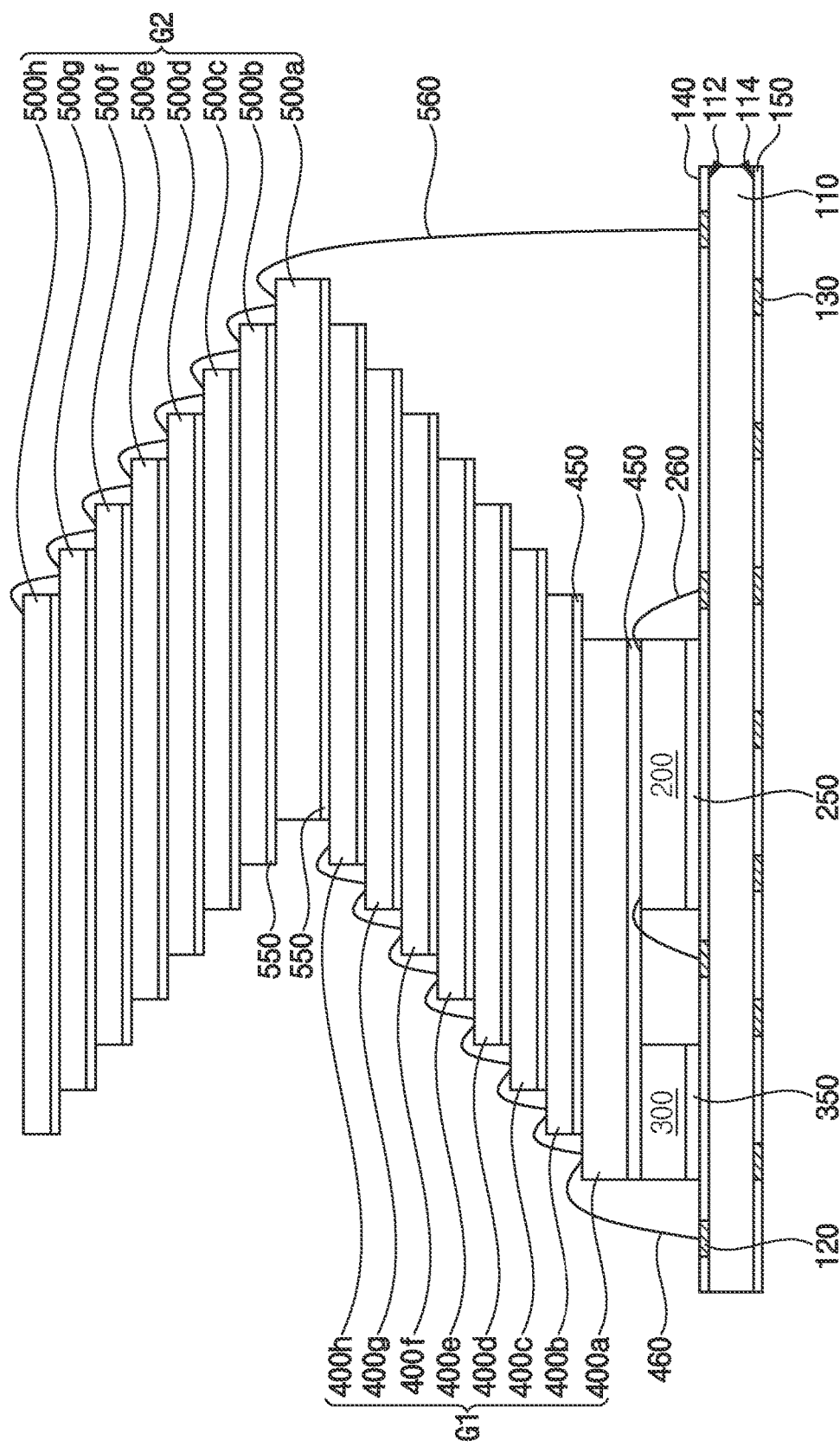

Referring to FIG. 14, a second chip stack structure G2 including a plurality of second semiconductor chips 500a, 500b, 500c, 500d, 500e, 500f, 500g and 500h may be stacked on the first chip stack structure G1.

The lowermost second semiconductor chip 500a among the plurality of second semiconductor chips may be substantially the same as or similar to the base chip 400a of FIG. 5. The plurality of upper chips 500b, 500c, 500d, 500e, 500f, 500g and 500h may be substantially the same as or similar to the chip 400b of FIG. 10.

As illustrated in FIG. 14, the lowermost second semiconductor chip 500a as the base chip may be stacked on the uppermost first semiconductor chip 400h. The lowermost second semiconductor chip 500a may be disposed on the package substrate 110 such that a second surface opposite to a first surface on which the chip pads are formed faces the package substrate 110.

Then, a plurality of upper chips 500b, 500c, 500d, 500e, 500f, 500g and 500h may be sequentially stacked on the lowermost second semiconductor chip 500a.

Each of the plurality of upper chips 500b, 500c, 500d, 500e, 500f, 500g and 500h may be disposed on the package substrate 110 such that a second surface opposite to a first surface on which the chip pads are formed faces the package substrate 110.

The plurality of upper chips may be sequentially offset-aligned. For example, the plurality of upper chips 500b, 500c, 500d, 500e, 500f, 500g and 500h may be stacked in a second cascade structure, as illustrated in FIG. 14. The plurality of upper chips 500b, 500c, 500d, 500e, 500f, 500g and 500h may be sequentially offset-aligned in a second lateral direction (left direction) of the package substrate 110 that is opposite to the first lateral direction, as illustrated in FIG. 14. The plurality of upper chips 500b, 500c, 500d, 500e, 500f, 500g and 500h may be attached on the lowermost second semiconductor chip 500a using an adhesive film 550 such as a DAF. For example, the upper chip 500b is attached to the base chip 500a using an adhesive film 550, and the upper chips 500b-500h are attached together via a respective adhesive film 550 between adjacent ones of the upper chips 500b-500h.

Then, a wire bonding process may be performed to connect the chip pads of the plurality of second semiconductor chips 500a, 500b, 500c, 500d, 500e, 500f, 500g and 500h to the substrate pad on the upper surface 112 of the package substrate 110. The chip pads of the second semiconductor chips 500a, 500b, 500c, 500d, 500e, 500f, 500g and 500h of the second chip stack structure G2 may be connected to the substrate pads 120 by third conductive connection members 560, i.e., bonding wires.

Figure 15:
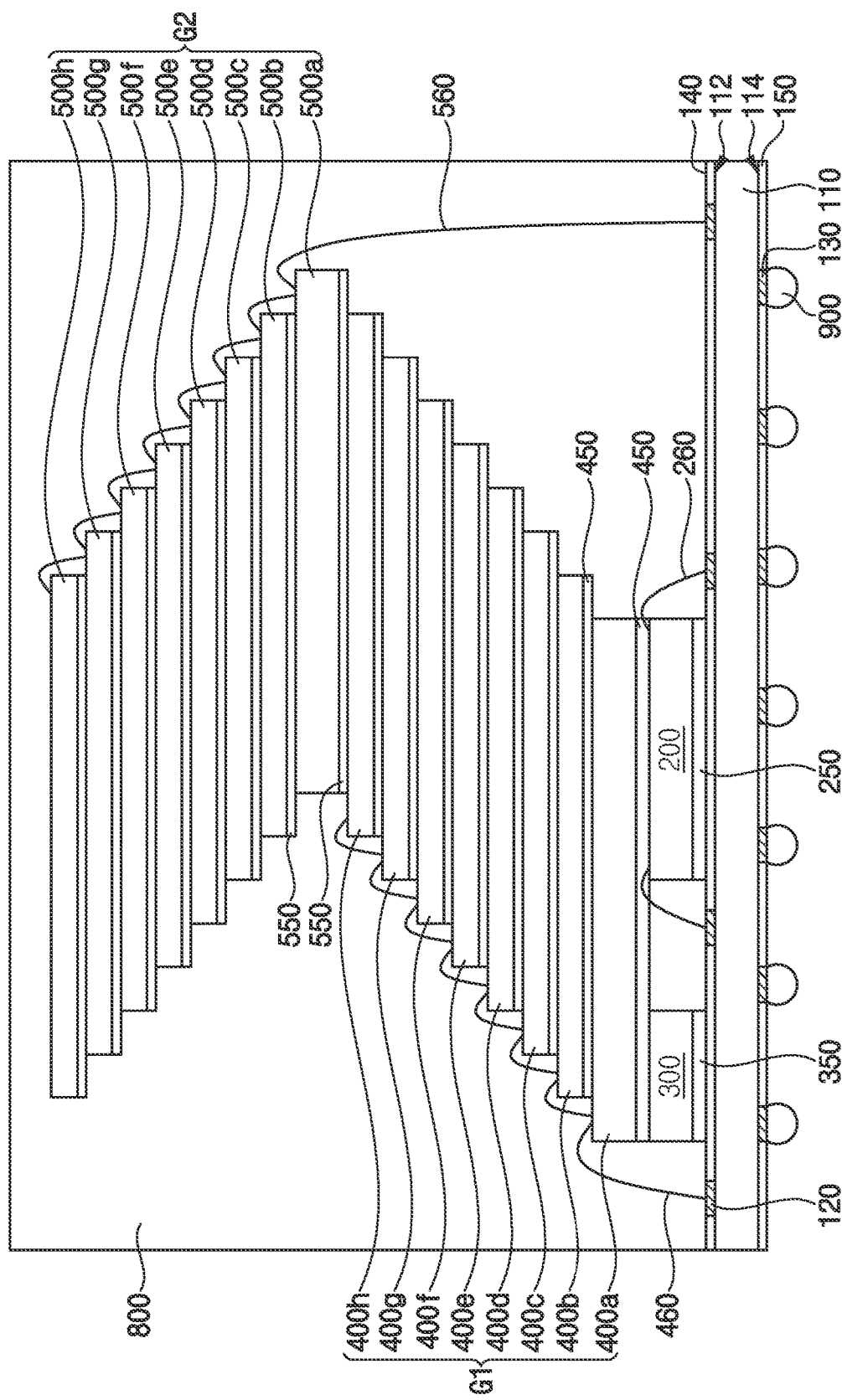

Referring to FIG. 15, a sealing member 800 may be formed on the upper surface 112 of the package substrate 110 to cover the first semiconductor chip 200, the support spacer 300, the first chip stack structure G1 and the second chip stack structure G2. The sealing member may include an epoxy mold compound (EMC).

Then, external connection members 900 such as solder balls may be formed on external connection pads 130 on the lower surface 114 of the package substrate 110 to complete the semiconductor package 100 of FIG. 1.

Figure 16:
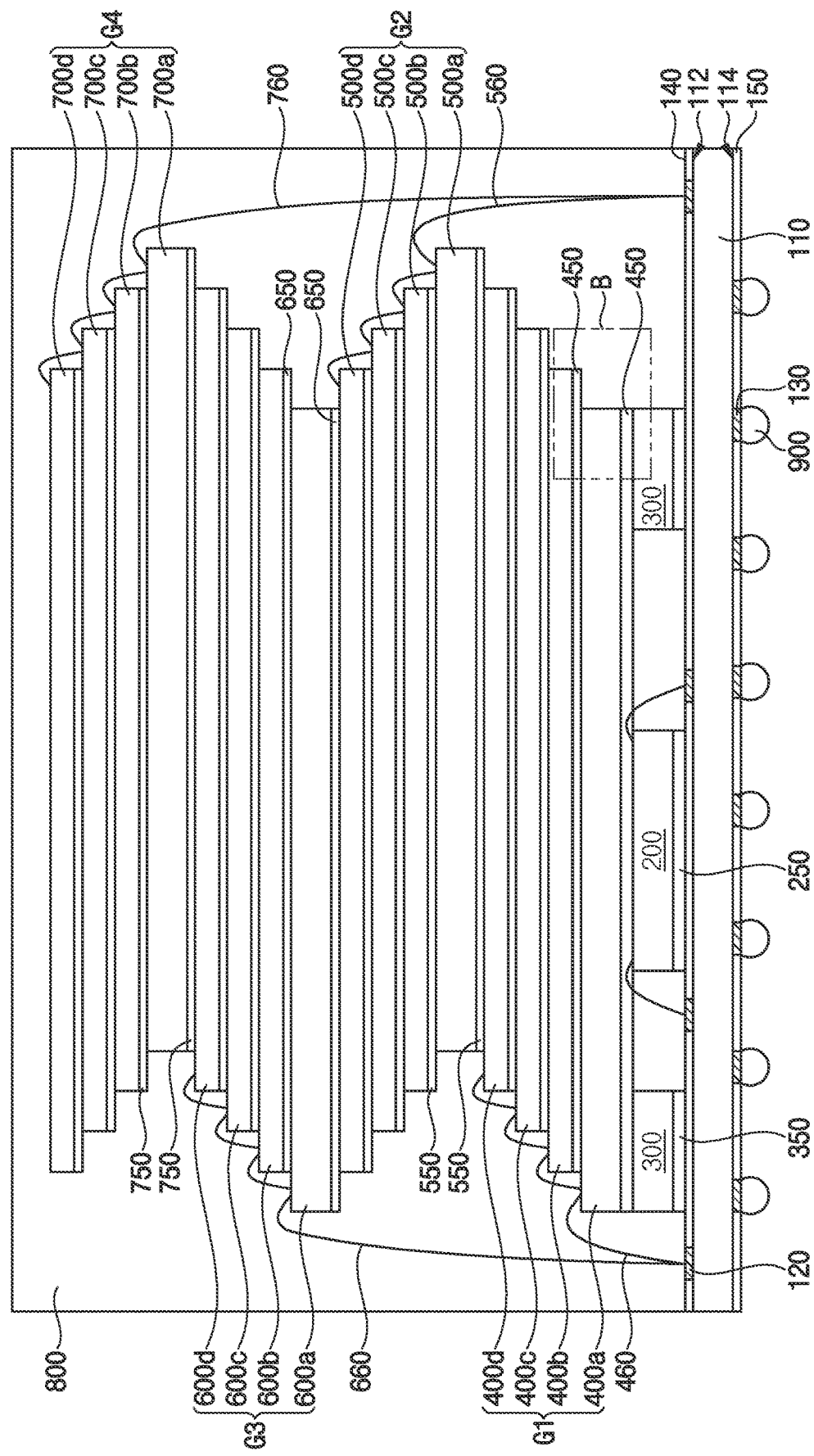
Figure 17:
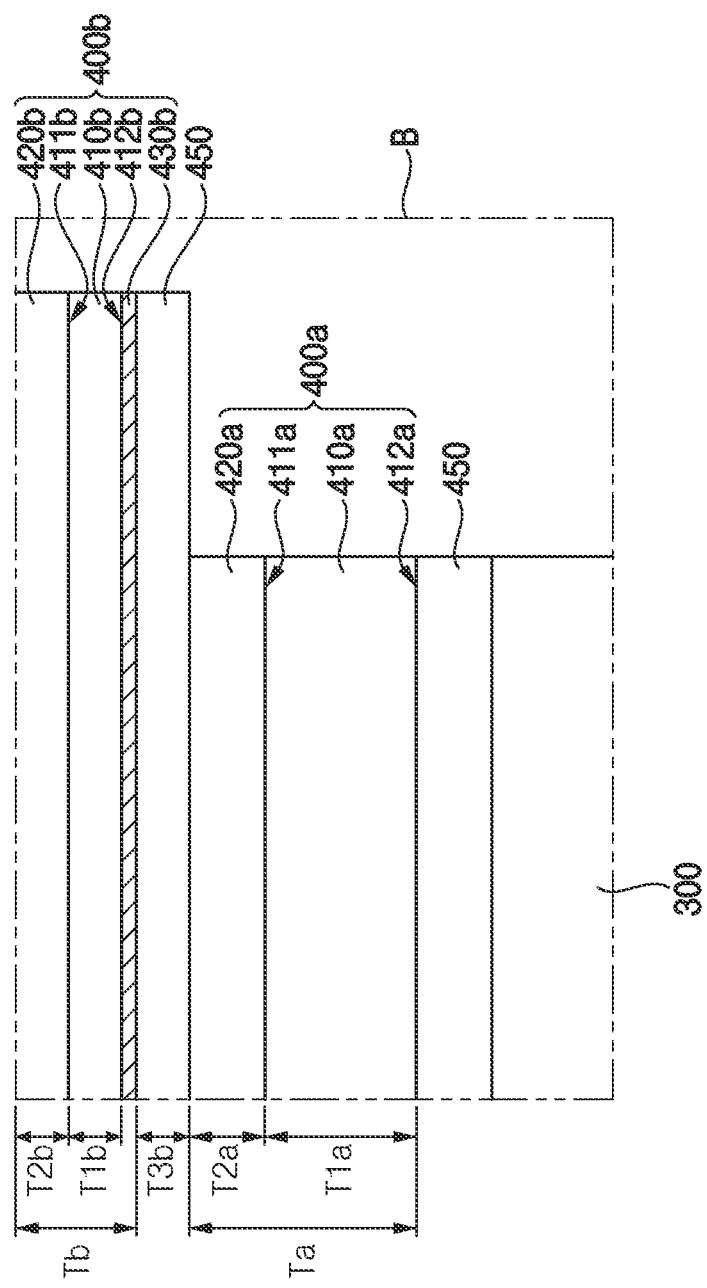

FIG. 16 is a cross-sectional view illustrating a semiconductor package in accordance with example embodiments. FIG. 17 is an enlarged cross-sectional view illustrating portion 'B' in FIG. 16. The semiconductor package may be substantially the same as or similar to the semiconductor package described with reference to FIGS. 1 and 2 except for an additional support structure and an arrangement of semiconductor chips. Thus, same reference numerals will be used to refer to the same or like elements and any further repetitive explanation concerning the above elements will be omitted.

Referring to FIGS. 16 and 17, a semiconductor package 101 may include a package substrate 110, a semiconductor chip 200, two support spacers 300, first, second, third and fourth chip stack structures G1, G2, G3 and G4, and a sealing member 800. Additionally, the semiconductor package 101 may further include external connection members 900.

In example embodiments, the two support spacers 300 may be spaced apart from the semiconductor chip 200 on the package substrate 110. Each of the two support spacers 300 may be on a respective side of the semiconductor chip 200, as illustrated. Each support spacer 300 may be attached on an upper surface 112 of the package substrate 110 using an adhesive member 350. Each support spacer 300 may include a dummy substrate or a dummy chip.

A thickness of each support spacer 300 may be determined in consideration of a thickness of the semiconductor chip 200. A height of the semiconductor chip 200 on the package substrate 110 may be the same as a height of each support spacer 300. Accordingly, the upper surface of the semiconductor chip 200 and the upper surface of each support spacer 300 may be on the same plane.

In example embodiments, the first chip stack structure G1 may be stacked on the semiconductor chip 200 and each support structure 300 on the package substrate 110. Accordingly, the first chip stack structure G1 may be supported and mounted on the package substrate 110 by the semiconductor chip 200 and each support structure 300.

The first chip stack structure G1 may include a plurality of first memory chips 400a, 400b, 400c and 400d sequentially stacked on the semiconductor chip 200 and the support spacers 300. For example, the first memory chip may include a nonvolatile memory device such as DRAM or NAND flash memory.

The first chip stack structure G1 may include first memory chips 400a, 400b, 400c and 400d of the same type. The first memory chips 400a, 400b, 400c and 400d may be sequentially attached on the semiconductor chip 200 and the support spacers 300 using respective adhesive members 450 between adjacent ones of the first memory chips 400a, 400b, 400c, 400d. The first memory chips 400a, 400b, 400c and 400d may be stacked in a cascade structure, as illustrated in FIG. 16. The first memory chips 400b, 400c and 400d may be sequentially offset-aligned in a first lateral direction (right direction) of the package substrate 110, as illustrated in FIG. 16.

For example, the adhesive member may include an adhesive film such as a direct adhesive film (DAF).

A thickness Ta of the lowermost first memory chip 400a, that is, a base chip among the plurality of first memory chips, may be greater than a thickness Tb of the upper chips 400b, 400c and 400d stacked on the base chip 400a.

Each of the upper chips 400b, 400c and 400d sequentially stacked on the base chip 400a may include a stress compensation layer 430b formed on a second surface 412b of a substrate 410b. The stress compensation layer may have an internal stress such as tensile stress or compressive stress, for example, as a result of a tensile force or a compressive force applied to or created in the stress compensation layer 430b during formation. Due to the internal stress, the stress compensation layer 430b may have a warpage with a positive value or a negative value. For example, the stress compensation layer 430b may be warped in a first direction, e.g., upwardly, or may be warped in a second direction, e.g., downwardly, opposite to the first direction. The stress compensation layer may compensate for the stress of the substrate to have a warpage capable of offsetting the warpage of the substrate.

The first memory chips 400a, 400b, 400c and 400d may be electrically connected to the package substrate 110 by conductive connection members 460. Specifically, the second conductive connection members 460 may electrically connect chip pads of the first memory chip to the substrate pads 120 of the package substrate 110. For example, the second conductive connection member 460 may include a bonding wire. Accordingly, the first memory chips may be electrically connected to the package substrate 110 by the plurality of second conductive connection members 460.

The type and number of the memory chips of the first chip stack structure G1 may not be limited thereto. For example, the first chip stack structure G1 may further include a plurality of first memory chips.

In example embodiments, the second chip stack structure G2 may include a plurality of second memory chips 500a, 500b, 500c and 500d sequentially stacked on the first chip stack structure G1. For example, the second memory chip may include a nonvolatile memory device such as DRAM or NAND flash memory.

The second chip stack structure G2 may include second memory chips 500a, 500b, 500c, and 500d of the same type. The second memory chips 500a, 500b, 500c and 500d may be sequentially attached to the first chip stack structure G1 using respective adhesive members 550 between adjacent ones of the second memory chips 500a-500d. The second memory chips 500a, 500b, 500c and 500d may be stacked in a cascade structure, as illustrated in FIG. 16. The second memory chips 500b, 500c and 500d may be sequentially offset-aligned in a second lateral direction (left direction) of the package substrate 110, as illustrated in FIG. 16.

For example, the adhesive member 550 may include an adhesive film such as a direct adhesive film (DAF).

A thickness of the lowermost second memory chip 500a, that is, a base chip among the plurality of second memory chips, may be greater than a thickness of the upper chips 500b, 500c and 500d stacked on the base chip 500a.

Each of the upper chips 500b, 500c and 500d sequentially stacked on the base chip 500a may include a stress compensation layer formed on the second surface of the substrate. The stress compensation layer may have an internal stress such as tensile stress or compressive stress, for example, as a result of a tensile force or a compressive force applied to or created in the stress compensation layer during formation. Due to the internal stress, the stress compensation layer may have a warpage with a positive value or a negative value. For example, the stress compensation layer may be warped in a first direction, e.g., upwardly, or may be warped in a second direction, e.g., downwardly, opposite to the first direction. The stress compensation layer may compensate for the stress of the substrate to have a warpage capable of offsetting the warpage of the substrate.

The second memory chips 500a, 500b, 500c and 500d may be electrically connected to the package substrate 110 by conductive connection members 560. Specifically, the third conductive connection members 560 may electrically connect chip pads of the second memory chip to the substrate pads 120 of the package substrate 110. For example, the third conductive connection member 560 may include a bonding wire. Accordingly, the second memory chips may be electrically connected to the package substrate 110 by the plurality of second conductive connection members 560.

In example embodiments, the third chip stack structure G3 may include a plurality of third memory chips 600a, 600b, 600c and 600d sequentially stacked on the second chip stack structure G2. For example, the third memory chip may include a nonvolatile memory device such as DRAM or NAND flash memory.

The third chip stack structure G3 may include third memory chips 600a, 600b, 600c and 600d of the same type. The third memory chips 600a, 600b, 600c and 600d may be sequentially attached on the second chip stack structure G2 using respective adhesive members 650 between adjacent ones of the third memory chips 600a-600d. The third memory chips 600a, 600b, 600c and 600d may be stacked in a cascade structure, as illustrated in FIG. 16. The third memory chips 600b, 600c and 600d may be sequentially offset-aligned in a first lateral direction (right direction) of the package substrate 110, as illustrated in FIG. 16. For example, the adhesive member may include an adhesive film such as a direct adhesive film (DAF).

A thickness of the lowermost third memory chip 600a, that is, a base chip among the plurality of third memory chips may be greater than a thickness of the upper chips 600b, 600c and 600d stacked on the base chip 600a.

Each of the upper chips 600b, 600c, and 600d sequentially stacked on the base chip 600a may include a stress compensation layer formed on the second surface of the substrate. The stress compensation layer may have an internal stress such as tensile stress or compressive stress, for example, as a result of a tensile force or a compressive force applied to or created in the stress compensation layer during formation. Due to the internal stress, the stress compensation layer may have a warpage with a positive value or a negative value. For example, the stress compensation layer may be warped in a first direction, e.g., upwardly, or may be warped in a second direction, e.g., downwardly, opposite to the first direction. The stress compensation layer may compensate for the stress of the substrate to have a warpage capable of offsetting the warpage of the substrate.

The third memory chips 600a, 600b, 600c and 600d may be electrically connected to the package substrate 110 by conductive connection members 660. Specifically, the fourth conductive connection members 660 may electrically connect chip pads of the third memory chip to the substrate pads 120 of the package substrate 110. For example, the fourth conductive connection member 660 may include a bonding wire. Accordingly, the third memory chips may be electrically connected to the package substrate 110 by a plurality of the third conductive connection members 660.

In example embodiments, the fourth chip stack structure G4 may include a plurality of fourth memory chips 700a,

700b, 700c and 700d sequentially stacked on the third chip stack structure G3. For example, the fourth memory chip may include a nonvolatile memory device such as DRAM or NAND flash memory.

The fourth chip stack structure G4 may include fourth memory chips 700a, 700b, 700c, and 700d of the same type. The fourth memory chips 700a, 700b, 700c and 700d may be sequentially attached on the third chip stack structure G3 using respective adhesive members 750 between adjacent ones of the fourth memory chips 700a-700d. The fourth memory chips 700a, 700b, 700c and 700d may be stacked in a cascade structure, as illustrated in FIG. 16. The fourth memory chips 700b, 700c and 700d may be sequentially offset-aligned in the second lateral direction (left direction) of the package substrate 110, as illustrated in FIG. 16. For example, the adhesive member may include an adhesive film such as a direct adhesive film (DAF).

A thickness of the lowermost fourth memory chip 700a, that is, a base chip among the plurality of fourth memory chips, may be greater than a thickness of the upper chips 700b, 700c and 700d stacked on the base chip 700a.

Each of the upper chips 700b, 700c and 700d sequentially stacked on the base chip 700a may include a stress compensation layer formed on the second surface of the substrate. The stress compensation layer may have an internal stress such as tensile stress or compressive stress, for example, as a result of a tensile force or a compressive force applied to or created in the stress compensation layer during formation. Due to the internal stress, the stress compensation layer may have a warpage with a positive value or a negative value. For example, the stress compensation layer may be warped in a first direction, e.g., upwardly, or may be warped in a second direction, e.g., downwardly, opposite to the first direction. The stress compensation layer may compensate for the stress of the substrate to have a warpage capable of offsetting the warpage of the substrate.

The fourth memory chips 700a, 700b, 700c and 700d may be electrically connected to the package substrate 110 by conductive connection members 760. Specifically, the fifth conductive connection members 760 may electrically connect chip pads of the fourth memory chip to the substrate pads 120 of the package substrate 110. For example, the fifth conductive connection member 760 may include a bonding wire. Accordingly, the fourth memory chips may be electrically connected to the package substrate 110 by a plurality of the fourth conductive connection members 760.

In example embodiments, the sealing member 800 may be formed on the package substrate 110 to cover the first semiconductor chip 200, the first chip stack structure G1, the second chip stack structure G2, the third chip stack structure G3 and the fourth chip stack structure G4 to be protected from the outside. The sealing member may include an epoxy mold compound (EMC).

External connection pads 130 for providing electrical signals may be provided on the lower surface 114 of the package substrate 110. The external connection pads 130 may be exposed by a second insulating layer 150. The second insulating layer may include a silicon oxide layer, a silicon nitride layer, or a silicon oxynitride layer. An external connection member 900 may be disposed on the external connection pad 130 of the package substrate 110 for electrical connection with an external device. For example, the external connection member 900 may be a solder ball. The semiconductor package 101 may be mounted on a module substrate (not shown) via the solder balls to constitute a memory module.

The semiconductor package may include semiconductor devices such as logic devices or memory devices. The semiconductor package may include logic devices such as central processing units (CPUs), main processing units (MPUs), or application processors (APs), or the like, and volatile memory devices such as DRAM devices, HBM devices, or non-volatile memory devices such as flash memory devices, PRAM devices, MRAM devices, ReRAM devices, or the like.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present invention. Accordingly, all such modifications are intended to be included within the scope of example embodiments as defined in the claims.

What is claimed is:

1. A semiconductor package, comprising:
   a package substrate;
   a chip stack structure on the package substrate, the chip stack structure comprising a base chip having a first thickness, and a plurality of upper chips sequentially stacked on the base chip, wherein the plurality of upper chips each have a second thickness smaller than the first thickness; and
   a sealing member on an upper surface of the package substrate and on the chip stack structure;
   wherein at least one of the plurality of upper chips comprises:
   a chip substrate having opposite first and second surfaces;
   a circuit layer on the first surface; and
   a stress compensation layer on the second surface, wherein the stress compensation layer has an internal stress that offsets a warpage of the chip substrate.

2. The semiconductor package of claim 1, wherein the second thickness of each of the plurality of upper chips is within a range of about 15 μm to 40 μm.

3. The semiconductor package of claim 1, wherein the chip substrate of the at least one of the plurality of upper chips has a thickness within a range of about 5 μm to 15 μm, the circuit layer has a thickness within a range of about 15 μm to 35 μm, and the stress compensation layer has a thickness within a range of about 0.01 μm to 1 μm.

4. The semiconductor package of claim 1, wherein the stress compensation layer comprises silicon oxide, silicon nitride or silicon oxynitride.

5. The semiconductor package of claim 1, wherein the stress compensation layer is on an entirety of the second surface of the chip substrate of the at least one of the plurality of upper chips.

6. The semiconductor package of claim 1, wherein the plurality of upper chips are sequentially attached to the base chip via adhesive film between adjacent ones of the plurality of upper chips and between a lowermost one of the plurality of upper chips and the base chip.

7. The semiconductor package of claim 1, further comprising:
   a plurality of conductive connection members electrically connecting chip pads of the base chip and the plurality of upper chips to substrate pads of the package substrate.

8. The semiconductor package of claim 7, wherein the plurality of upper chips are on the package substrate such that the second surface of the chip substrate of the at least one of the plurality of upper chips faces the package substrate.

9. The semiconductor package of claim 1, further comprising:
a first semiconductor chip on the package substrate, and wherein the base chip is attached on top of the first semiconductor chip.

10. The semiconductor package of claim 9, wherein the first semiconductor chip comprises a logic chip, and the base chip and the plurality of upper chips each comprise a memory chip.

11. A semiconductor package, comprising:
a package substrate;
a semiconductor chip on an upper surface of the package substrate;
a support spacer on the upper surface of the package substrate and spaced apart from the semiconductor chip;
a chip stack structure on the semiconductor chip and the support spacer, the chip stack structure comprising a base chip having a first thickness and a plurality of upper chips sequentially stacked on the base chip, wherein the plurality of upper chips each have a second thickness smaller than the first thickness; and
a sealing member on the upper surface of the package substrate, on the semiconductor chip, on the support spacer, and on the chip stack structure,
wherein each of the plurality of upper chips comprises:
a chip substrate having opposite first and second surfaces;
a circuit layer on the first surface; and
a stress compensation layer on the second surface and comprising an internal stress that offsets an internal stress of the chip substrate.

12. The semiconductor package of claim 11, wherein the chip substrate of each of the plurality of upper chips has a thickness within a range of about 5 µm to 15 µm, the circuit layer of each of the plurality of upper chips has a thickness within a range of about 15 µm to 35 µm, and the stress compensation layer of each of the plurality of upper chips has a thickness within a range of about 0.01 µm to 1 µm.

13. The semiconductor package of claim 11, wherein the stress compensation layer of each of the plurality of upper chips comprises silicon oxide, silicon nitride or silicon oxynitride.

14. The semiconductor package of claim 11, further comprising:
a plurality of conductive connection members electrically connecting chip pads of the base chip and the plurality of upper chips to substrate pads of the package substrate.

15. The semiconductor package of claim 11, wherein the semiconductor chip comprises a logic chip, and the base chip and the plurality of upper chips each comprise a memory chip.

16. A method of manufacturing a semiconductor package, the method comprising:
providing a first wafer having a first thickness;
providing a second wafer having a second thickness less than the first thickness;
dicing the first wafer to form a base chip;
forming a stress compensation layer on a backside surface of the second wafer, the stress compensation layer comprising an internal stress selected to offset an internal stress within the second wafer;
dicing the second wafer to form a plurality of upper chips;
attaching the base chip to an upper surface of a package substrate;
sequentially stacking the plurality of upper chips on the base chip; and
forming a sealing member on the upper surface of the package substrate, on the base chip, and on the plurality of upper chips.

17. The method of claim 16, wherein the forming the stress compensation layer comprises performing a sputtering process or a plasma deposition process on the backside surface of the second wafer.

18. The method of claim 16, wherein the sequentially stacking of the plurality of upper chips on the base chip comprises attaching the plurality of upper chips to the package substrate such that the stress compensation layer on each of the plurality of upper chips faces the package substrate.

19. The method of claim 18, wherein the sequentially stacking of the plurality of upper chips on the base chip comprises attaching the plurality of upper chips to the base chip using adhesive film between adjacent ones of the plurality of upper chips and between a lowermost one of the plurality of upper chips and the base chip.

20. The method of claim 16, further comprising:
electrically connecting chip pads of the base chip and the plurality of upper chips to substrate pads of the package substrate using a plurality of conductive connecting members.

* * * * *